US006010816A

United States Patent [19]

Nishio et al.

[11] Patent Number: 6,010,816

[45] Date of Patent: Jan. 4, 2000

[54] ALUMINUM ALLOY SUPPORT FOR PLANOGRAPHIC PRINTING PLATE

[75] Inventors: Kazuyuki Nishio; Takahiro Mori, both of Hino, Japan

[73] Assignee: Konica Corporation, Japan

[21] Appl. No.: 09/000,544

[22] Filed: Dec. 30, 1997

[30] Foreign Application Priority Data

Jan. 10, 1997 [JP] Japan .................................... 9-002874

[51] Int. Cl.$^{7}$ ............................ G03C 1/52; C22C 21/10; G03F 7/09; B41N 1/08

[52] U.S. Cl. ....................... 430/165; 430/190; 430/278.1; 420/540

[58] Field of Search .................................... 430/165, 190, 430/278.1; 420/540

[56] References Cited

U.S. PATENT DOCUMENTS

| | | | |
|---|---|---|---|
| 4,197,128 | 4/1980 | Watanabe et al. | 430/193 |
| 4,207,106 | 6/1980 | Odawara et al. | 430/165 |
| 4,217,407 | 8/1980 | Watanabe et al. | 430/166 |
| 4,307,173 | 12/1981 | Gventer | 430/165 |
| 4,500,625 | 2/1985 | Kita et al. | 430/149 |
| 4,547,274 | 10/1985 | Ohashi et al. | 204/129.4 |
| 4,606,995 | 8/1986 | Kita et al. | 430/302 |
| 4,634,656 | 1/1987 | Ohashi et al. | 430/278 |
| 5,064,741 | 11/1991 | Koike et al. | 430/191 |

FOREIGN PATENT DOCUMENTS

| | | |
|---|---|---|
| 0164856 | 12/1995 | European Pat. Off. . |
| 46-36091 | 10/1971 | Japan . |

OTHER PUBLICATIONS

Suginuma et al. "Manufacture of Corrosion Resistant Zinc Alloy–Coated Steel Wire", JP404167942A, Abstract, Nov. 1990.

Fukumaki et al. "Brazing Filler Metal and Method for Al", JP59179288, Abstract, Oct. 1984.

Fray et al. "Method for adding traces of sodium to a melt of aluminium or an aluminium alloy", EP000688881A1, Abstract, Dec. 1995.

XP–002063969 Derwent (1 page).

XP–002063968 Aluminium Alloys Uchida et al (1 page).

Patent Abstracts of Japan 07098498 Apr. 11, 1995 (1 page) Fumiyuki.

Patent Abstracts of Japan 03177528 Aug. 1, 1991 (1 page) Hirokazu.

*Primary Examiner*—Cynthia Hamilton
*Assistant Examiner*—Yvette M. Clarke
*Attorney, Agent, or Firm*—Jordan B. Bierman; Bierman, Muserlian and Lucas

[57] ABSTRACT

Disclosed is an aluminum alloy support for a planographic printing plate, wherein the sodium content of the support is 0.005 to 0.040 weight %.

8 Claims, No Drawings

ALUMINUM ALLOY SUPPORT FOR PLANOGRAPHIC PRINTING PLATE

FIELD OF THE INVENTION

The invention relates to an aluminum alloy support for a planographic printing plate.

BACKGROUND OF THE INVENTION

As a support for a planographic printing plate, a plate made of pure aluminum or an aluminum alloy has been so far used. As the aluminum alloy are used various aluminum alloys containing silicon, copper, manganese, magnesium, chromium, zinc, lead, bismuth, nickel, titanium, sodium or iron. Generally, an aluminum alloy rolled plate with a thickness of 0.1 to 0.5 mm according to JIS Standard A1050 or A1100 is used. Such an aluminum alloy rolled plate is surface roughened by a mechanical method, an electrochemical method, a chemical method or a combination thereof, and then anodized to obtain a support for a printing plate.

The thus obtained aluminum alloy support, which has been surface roughened, is required to have a uniformly roughened surface without unevenness, defects or streaks in a direction of rolling. The unevenness or defects are likely to cause stains on the support surface due to ink acceptance at printing. In order to remove such unevenness or defects, there have been proposed an aluminum alloy support with a specific content of Fe, Sn, In, Ga and Zn, a specific surface roughness and a specific pit size as disclosed in JP-A-58-209597, an aluminum alloy support with a specific content of Mn and Si as disclosed in JP-A-60-230951, an aluminum alloy support with a specific content of Mn and Si subjected to a specific heat treatment as disclosed in JP-A-62-80255, an aluminum alloy support with a specific content of Mg and Mn, and with a specific crystal particle width as disclosed in JP-A-62-86143, an aluminum alloy support with a specific content of Si, Fe, Mn and Cu as disclosed in JP-A-1-306288, an aluminum alloy support with a specific content of Mg, Si, and Cu as disclosed in JP-A-1-61293, and an aluminum alloy support with a specific content of Si, Fe, Cu, Ga, Ni, and Ti as disclosed in JP-A-3-177528. However, any proposal cannot sufficiently prevent occurrence of stains on the support caused due to ink acceptance.

SUMMARY OF THE INVENTION

The present invention has been made in order to solve the problems described above. An object of the invention is to provide an aluminum alloy support for a planographic printing plate, which prevents stains occurred on the support due to unevenness or defects (or at non-image portions of prints), or minute spots (stop dirtiness) occurred on the support (or at non-image portions of prints) at resumption of a print run.

DETAILED DESCRIPTION OF THE INVENTION

The above objects of the invention can be attained by the following:

1. an aluminum alloy support for a planographic printing plate, wherein the sodium content of the support is 0.005 to 0.040 weight %, 2. the aluminum alloy support of item 1 above, wherein the total content of sodium and zinc in the support is 0.01 to 0.040 weight %,
3. a presensitized planographic printing plate comprising a support and provided thereon, a light sensitive layer, wherein the support is an aluminum alloy support having a sodium content of 0.005 to 0.040 weight %,
4. the presensitized planographic printing plate of item 3, wherein the support is an aluminum alloy support having the total content of sodium and zinc of 0.01 to 0.040 weight %,
5. the presensitized planographic printing plate of item 3, wherein the light sensitive layer contains an alkali soluble resin and an o-quinonediazide compound,
6. the presensitized planographic printing plate of item 5, wherein the light sensitive layer contains the alkali soluble resin in an amount of 5 to 90% by weight and the o-quinonediazide compound in an amount of 6 to 60% by weight,
7. the presensitized planographic printing plate of item 5, wherein the o-quinonediazide compound is an ester compound of o-naphthoquinonediazide sulfonic acid and a polycondensate resin of phenols with aldehydes or ketones,
8. the presensitized planographic printing plate of item 5, wherein the dry coating amount of the light sensitive layer is 0.2 to 10 $g/m^2$,
9. the presensitized planographic printing plate of item 3, wherein the support has a thickness of 0.10 to 0.50 mm, or
10. the presensitized planographic printing plate of item 5, wherein the support is subjected to roughening treatment and anodizing treatment.

The present inventors have made an extensive study on an aluminum alloy support for a planographic printing plate. As a result, the present inventors have found that the aluminum alloy support having a sodium content of 0.005 to 0.040 weight % can prevent occurrence of stains on the support and attained the present invention. The present invention further provides a surprising effect that minimizes occurrence of stop dirtiness after printing is started, stopped to rest or register for a while, and then restarted.

The present invention will be explained below.

The aluminum alloy support of the invention for a planographic printing plate contains sodium in an amount 0.005 to 0.040 weight %.

The aluminum alloy support of the invention may inevitably contain impurities other than sodium. The content of such impurities is, for example, the content as shown in JIS Standard A1050 (not more than 0.25 weight % of Si, not more than 0.40 weight % of Fe, not more than 0.05 weight % of Cu, not more than 0.05 weight % of Mn, not more than 0.05 weight % of Mg, not more than 0.05 weight % of Zn, not more than 0.03 weight % of Ti). Impurities at such contents can still attain the object of the invention.

The reason that the sodium content described above prevents occurrence of stains or stop dirtiness on the printing plate support is not apparent, but is considered to be as follows:

Most other metals, which may be contained in the aluminum alloy support in minute quantities, are chemically stable compared with aluminum, and therefore, the relatively unstable aluminum is likely to be corroded. Aluminum is the main element in the aluminum alloy support, and once the corrosion continuously proceeds, unevenness or defects on the surface are likely to occur. Such defects have a higher pit depth/pit size ratio as compared with hemispherical pits obtained by electrolytic roughening of the surface, and therefore, easily accept contamination.

When a metal more chemically unstable than aluminum is hradded, corrosion of the metal precedes. When the content of such a metal is reduced to an infinitesimal amount, corrosion of the aluminum alloy can be minimized. Accordingly, a minute amount of sodium in the aluminum alloy support is distributed at a minute quantity in the support, and preceding corrosion of the sodium produces only a minimal size of unevenness or defects which has no adverse effect on printing properties, for example, the properties preventing stain occurrence or stop dirtiness occurrence. In the invention, the minute amount of sodium in the aluminum alloy support is considered to minimize unevenness or defects on the support surface and show the advantageous effects of the invention preventing stain occurrence or stop dirtiness occurrence.

Mechanism of the occurrence of stop dirtiness is not clear, but is considered to be as follows:

When printing is stopped, the planographic printing plate dries since dampening water is not supplied thereto. The dried plate, which has a support surface with unevenness or defects or a surface with non-uniform wettability, results in ink aggregation, and at resumption of a print run, brings about occurrence of stop dirtiness.

In the invention, the sodium content of the aluminum alloy support is 0.005 to 0.040 weight %, and preferably 0.010 to 0.020 weight %.

The aluminum alloy support of the invention for a planographic printing plate and a manufacturing method of a presensitized planographic printing plate employing the support will be explained below.

Aluminum alloy having a composition as described above is melted and molded according to conventional methods. As a molding method, a semi-continuous molding method (DC molding method) is generally used, but a thin plate continuous molding method (a continuous molding rolling method) may be used in view of energy saving or mechanical strength improvement. The resulting ingot is uniformized, hot rolled, cold rolled, and optionally annealed to obtain a plate having a thickness of preferably 0.10 to 0.50 mm, and more preferably 0.20 to 0.3 mm.

Uniformizing carried out after molding is necessary to decrease the size of minute recrystallization particles produced during annealing, and in uniformizing, the molded ingot is suitably maintained at 450 to 610° C. for 1 to 48 hours. Heat for uniformizing and heat for hot rolling need not be applied separately, but heat for uniformizing and for hot rolling may be applied at the same temperature, immediately followed by hot rolling. In either case, the temperature of heat application for hot rolling is 400 to 550° C. at the initial stage.

After hot rolling, the ingot is cold rolled to obtain a plate with a predetermined thickness, but the ingot is ordinarily annealed once or twice immediately after hot rolling or during cold rolling. The annealing temperature is suitably 300 to 600° C. When the annealing temperature is less than 300° C., the ingot is not completely recrystallized, and when the annealing temperature exceeds 600° C., the surface oxidation is serious, resulting in a disadvantageous increased size of the recrystallization particles.

The thus obtained aluminum alloy plate is preferably subjected to degreasing treatment for removing rolling oil on the surface, prior to roughening. The degreasing treatment to be used includes one employing a solvent such as trichlene or thinner, and emulsion degreasing treatment employing an emulsion such as kerosene and triethanol. It is also possible to use an aqueous solution containing alkali such as caustic soda for the degreasing treatment. When alkali aqueous solution such as caustic soda is used for the degreasing treatment, it is possible to remove even a stain and oxide film which can not be removed by aforesaid degreasing treatment alone. When an aqueous solution containing alkali such as caustic soda is used for the degreasing treatment, smut is caused on the surface of a support. In this case, it is preferable to perform desmutting treatment by dipping in an acid such as phosphoric acid, nitric acid, sulfuric acid and chromic acid, or in mixed acid thereof.

The aluminum alloy plate is followed by roughening treatment to give a uniformly roughened surface. The roughening method includes a mechanically roughening method such as a wire graining or brush graining method employing a rotating metal wire in a roll form or a rotating nylon brush, or a blast graining method jetting an abrasive onto the plate surface, an electrolytic roughening method, so-called electrolytic graining, a combination thereof, or a roughening method interposing therebetween a relatively strong chemical roughening.

In the invention, electrolytic roughening is preferable. For example, electrolytic roughening is carried out in a 1 to 10 weight % hydrochloric acid solution at 5 to 50° C., at 20 to 100 A/dm$^2$ of current density and a quantity of electricity of 100 to 800 C/dm$^2$. The electrolytic roughening plate is chemically treated with an acid or alkali to remove smut produced during electrolytic roughening. The acid includes sulfuric acid, persulfuric acid, fluoric acid, phosphoric acid, nitric acid and hydrochloric acid, and the alkali includes sodium hydroxide and potassium hydroxide. When the above roughening is carried out employing an aqueous alkali solution, smut is caused on the surface of the support. In this case, it is preferable to perform desmutting treatment by dipping in an acid such as phosphoric acid, nitric acid, sulfuric acid and chromic acid, or in mixed acid thereof.

After the roughening treatment, a conventional anodizing treatment is carried out. Direct current is supplied to the resulting aluminum plate in an aqueous solution containing sulfuric acid, phosphoric acid, chromic acid, oxalic acid, sulfamic acid or a combination thereof to form an anodized oxide film on the surface of the plate. The anodizing conditions vary depending on the electrolytic solution used, but the plate is generally anodized in an 1–50 weight % electrolyte solution at 5 to 50° C. for 1 to 100 seconds, at a current density of 2 to 10 A/m$^2$ and a voltage of 5 to 50 V to give an oxide film of 0.5 to 5 g/m$^2$. In the anodizing treatment, an electrolyte solution containing sulfuric acid or phosphoric acid is generally used.

The anodized aluminum alloy support may be further provided with a hydrophilic property. A hydrophilic property providing method includes a method of employing an alkali metal silicate (for example, an aqueous sodium silicate solution) disclosed in U.S. Pat. Nos. 2,714,066, 3,181,461, 3,280,734 and 3,902,734, a method of employing potassium zirconium fluoride disclosed in JP-B-36-22063, a method of employing polyvinyl sulfonic acid disclosed in U.S. Pat. Nos. 3,276,868, 4,153,416 and 4,689,272, a method of providing a subbing layer comprised of a hydrophilic resin and a water soluble salt on the support as disclosed in JP-A-56-21126, a method of providing a subbing layer comprised of a hydrophilic resin and an carboxylic acid salt on the support as disclosed in JP-A-64-14090, a method of providing, on the support, a hydrophilic layer containing at least one selected from compounds having an amino group and one of a carboxylic acid group and a sulfonic acid group, and salts thereof as disclosed in JP-A-63-130391, and a method of providing, on the support, a hydrophilic layer containing at least one selected from compounds having an amino group and a phosphone group, and salts thereof as disclosed in JP-A-63-165183.

On the aluminum alloy support of the invention for a planographic printing plate, a conventional light sensitive composition is provided to form a light sensitive layer. Thus, a presensitized planographic printing plate is obtained. The planographic printing plate obtained from this presensitized planographic printing plate has superior properties.

The light sensitive composition for the light sensitive layer is, for example, as follows:

(o-Quinonediazide Compound)

The o-quinonediazide compound includes an ester compound of o-naphthoquinonediazide sulfonic acid and a polycondensate resin of phenols with aldehydes or ketones.

Examples of the phenols include a monohydric phenol such as phenol, o-cresol, m-cresol, p-cresol, 3,5-xylenol, carvacrol and thymol, a dihydric phenol such as catechol, resorcin or hydroquinone, and a trihydric phenol such as pyrogallol or phloroglucin. Examples of the aldehydes include formaldehyde, benzaldehyde, acetaldehyde, crotonaldehyde and furfural. Preferred are formaldehyde and benzaldehyde. Examples of the ketones include acetone, and methyl ethyl ketone.

The polycondensate resin includes a phenol-formaldehyde resin, a m-cresol-formaldehyde resin, a mixed m- and p-cresol-formaldehyde resin, a resorcin-benzaldehyde resin, and a pyrogallol-acetone resin.

In the o-naphthoquinonediazide compound, the condensation ratio of the o-naphthoquinonediazide sulfonic acid to the hydroxyl group of the phenol component is 15 to 80 mol %, and preferably 20 to 45 mol %.

The o-quinonediazide compound used in the invention include those disclosed in Japanese Patent O.P.I. Publication No. 58-43451. The examples thereof include conventional 1,2-quinonediazide compounds such as 1,2-benzoquinonediazide-sulfonate, 1,2-benzoquinonediazidesulfonamide, 1,2-naphthoquinonediazide-sulfonate and 1,2-naphthoquinonediazide-sulfonamide and, further, include 1,2-quinonediazide compounds such as 1,2-benzoquinonediazide-4-sulfonic acid phenyl ester, 1,2,1',2'-di- (benzoquinonediazide-4-sulfonyl)dihydroxybiphenyl, 1,2-benzoquinonediazide-4-(N-ethyl-N-β-naphthyl) sulfonamide, 1,2-naphthoquinonediazide-5-sulfonic acid cyclohexyl ester, 1-(1,2-naphthoquinonediazide-5-sulfonyl)-3,5-dimethylpyrazole, 1,2-naphthoquinonediazide-5-sulfonic acid-4'-hydroxydiphenyl-4'-azo-β-naphthol ester, N,N-di-(1,2-naphthoquinonediazide-5-sulfonyl)-aniline, 2'-(1,2-naphthoquinonediazide-5-sulfonyloxy)-1-hydroxy-anthraquinone, 1,2-naphthoquinonediazide-5-sulfonic acid-2,4-dibydroxybenzophenone ester, 1,2-naphthoquinonediazide-5-sulfonic acid-2,3,4-trihydroxybenzophenone ester, a condensation product of 2 moles of 1,2-naphthoquinonediazide-5-sulfonic acid chloride with 1 mole of 4,4'-diaminobenzophenone, a condensation product of 2 moles of 1,2-naphthoquinonediazide-5-sulfonic acid chloride with 1 mole of 4,4'-dihydroxy-1,1'-diphenylsulfone, a condensation product between 1 mole of 1,2-naphthoquinonediazide-5-sulfonic acid chloride and 1 mole of purpurogallin, and 1,2-naphthoquinonediazide-5-(N-dihydroxyabiethyl)-sulfonamide described in J. Kosar, Light-Sensitive Systems, John Wily & Sons, New York, pp. 339–352 (1965) and W S. De Forest, Photoresist, Vol. 50, McGraw-Hill, New York (1975). Other examples are 1,2-naphthoquinonediazide compounds described in Japanese Pat. Exam. Pub. Nos. 37-1953, 37-3627, 37/13109, 40/26126, 40/3801, 45/5604, 45/27345 and 51/13013, and Japanese Pat. O.P.I. Pub. Nos. 48/96575, 48/63802 and 48/63803.

Among the above described o-quinonediazide compounds is especially preferable an o-quinonediazide ester compound obtained by reacting 1,2-benzoquinonediazide sulfonylchloride or 1,2-naphthoquinonediazide sulfonylchloride with a pyrogallol-acetone resin or 2,3,4-trihydroxybenzophenone.

In the invention, the o-quinonediazide compound may be used singly or in combination.

The light sensitive layer containing an o-quinonediazide compound preferably contains an alkali soluble resin. The alkali soluble resin includes a novolak resin, a vinyl polymer having a phenolic hydroxy group, and a polycondensate of polyhydric phenol with aldehyde or ketone disclosed in Japanese Patent O.P.I. Publication No. 55-57841. The alkali soluble resin is contained in the light sensitive layer in an amount of preferably 5 to 90% by weight.

The above novolak resin includes a phenol-formaldehyde resin, a cresol-formaldehyde resin, a phenol-cresol-formaldehyde resin disclosed in Japanese Patent O.P.I. Publication No. 55-57841, and a copolycondensate of a p-substituted phenol, and phenol or cresol with formaldehyde disclosed in Japanese Patent O.P.I. Publication No. 55-127553.

The novolak resin has a number average molecular weight (Mn) of preferably $3.00\times10^2$ to $7.50\times10^3$, more preferably $5.00\times10^2$ to $4.00\times10^3$, and a weight average molecular weight (Mw) of preferably $1.00\times10^3$ to $3.00\times10^4$, more preferably $3.00\times10^3$ to $2.00\times10^4$, in terms of polystyrene standard. The above novolak resin may be used singly or in combination. The novolak resin content of the light sensitive layer is preferably 5 to 85% by weight.

The o-quinonediazide compound content of the light sensitive layer is preferably 6 to 60% by weight, and more preferably 10 to 50% by weight. The light sensitive layer containing o-quinonediazide compounds optionally contains a plasticizer, a surfactant, an organic acid or an acid anhydride. The light sensitive layer can further contain a lipophilic agent such as a p-tert-butylphenol formaldehyde resin, a p-n-octylphenol formaldehyde resin or an ester resin thereof partially esterified with an o-quinonediazide compound in order to increase the lipophilicity of the light sensitive layer.

The light sensitive layer can further contain various additives other than those described above, for example, alkylethers (such as ethylcellulose or methylcellulose), a fluorine-containing surfactant, a nonioic surfactant (such as Pluronic L-64 produced by Asahidenka Co., Ltd.), a plasticizer for giving flexibility or antiabrasion to the coated layer (such as butylphthalate, polyethylene glycol, tributylcitrate, diethylphthalate, dibutylphthalate, dihexylphthalate, dioctylphthalate, tricresyl phosphate, tributyl phosphate, trioctyl phosphate, tetrahydrofurfuryloleate, an oligomer or polymer of acrylic acid or methacrylic acid), an lipophilic agent for improving a lipophilicity of image portions (such as an alcohol half ester of styrene-maleic anhydride copolymer disclosed in Japanese Patent O.P.I. Publication No. 55-527/1980), a stabilizing agent (such as phosphoric acid, phosphorous acid, an organic acid, for example, citric acid, oxalic acid, benzenesulfonic acid, naphthalene sulfonic acid, 4-methoxy-2-hydroxybenzophenone-5-sulfonic acid, glutaric acid), a development accelerator (such as higher alcohols or acid anhydrides). The content of these additives is generally 0.01 to 30 weight % based on the total solid component weight of the light sensitive layer, although it varies depending on the objects of the usage.

The presensitized lithographic printing plate in the invention is prepared by dissolving the components described above in a solvent to obtain a coating solution, coating the solution on the aluminum alloy support of the invention and then drying the coated to form a light sensitive layer on the support.

The solvent includes methylcellosolve, methylcellosolve acetate, ethylcellosolve, ethylcellosolve acetate, diethylene glycol monomethylether, diethylene glycol monoethylether, diethylene glycol dimethylether, diethylene glycol methylethylether, diethylene glycol diethylether, diethylene glycol monoisopropylether, propylene glycol, propylene glycol monoethylether acetate, propylene glycol monobutylether, dipropylene glycol monomethylether, dipropylene glycol dimethylether, dipropylene glycol methylethylether, ethyl formate, propyl formate, butyl formate, amyl formate, methyl acetate, ethyl acetate, propyl acetate, butyl acetate, methyl propionate, ethyl propionate, methyl butyrate, ethyl butyrate, dimethylformamide, dimethylsulfoxide, dioxane, acetone, methylethylketone, cyclohexanone, methylcyclohexanone, discetonealcohol, acetylacetone, γ-butyrolactone. These solvents can be used singly or in combination.

The coating method for coating the light sensitive layer on a support includes a conventional coating method such as whirl coating, wire bar coating, dip coating, air-knife coating, roll coating, blade coating or curtain coating. The solid component concentration of the light sensitive layer coating solution is preferably 1 to 50 weight %. The coating amount of the light sensitive layer is preferably 0.2 to 10.0 g/m$^2$, and more preferably 1.0 to 3.0 g/m$^2$, as a solid.

A backing layer (also called a back coat layer) containing metal oxides obtained by hydrolyzing or polycondensating organic or inorganic metal compounds is preferably provided on the surface of the aluminum alloy support of the invention opposite the light sensitive layer whereby an anodized aluminum oxide dissolution in developer is minimized.

The coating amount of the backing layer may be any, as long as it prevents from dissolving the aluminum in the developer. The coating amount of the backing layer is preferably 0.001 to 10 g m$^2$, more preferably 0.01 to 1 g/m$^2$, and still more preferably 0.02 to 0.1 g/m$^2$.

The backing layer can be coated on the surface of the support opposite the light sensitive layer according to various coating methods. In order to obtain the above described coating amount, the most preferable coating method is a method including preparing a backing layer coating solution, coating the solution on a support and drying.

The presensitized planographic printing plate is imagewise exposed to light through a transparent original having a line image or a dot image. The light source for exposure includes a carbon arc lamp, a mercury lamp, a xenon lamp, a metal halide lamp and strobe.

The exposed plate is developed with developer, washed with water or a rising solution, optionally gummed with a gumming solution, and dried to obtain a planographic printing plate for printing. The planographic printing plate is mounted on a printing machine and printing is carried out.

The developer used in the invention is preferably an aqueous alkaline solution. The alkali of the developer includes an alkali metal silicate such as potassium silicate, sodium silicate, sodium metasilicate, potassium metasilicate, or ammonium silicate, an inorganic alkali such as potassium hydroxide, sodium hydroxide, lithium hydroxide, sodium tertiary phosphate, sodium secondary phosphate, potassium tertiary phosphate, potassium secondary phosphate, ammonium tertiary phosphate, ammonium secondary phosphate, sodium bicarbonate, sodium carbonate, potassium carbonate, or ammonium carbonate, and an organic alkali such as monoethanol amine, diethanol amine, triethanol amine, or a tetraalkyl ammonium hydroxide. Preferred among these alkalis is the alkali metal silicate. The developer contains the alkali in an amount of preferably 0.3 to 10 weight %, and water in an amount of preferably not less than 50 weight %. The developer is especially preferably an aqueous solution having an alkali silicate content of 0.3 to 10 weight % in which the silicon dioxide ($SiO_2$) content of the silicate is 0.1 to 7.0 weight %.

The developer in the invention optionally contains other additives such as an organic acid, an anionic, nonionic or cationic surfactant, an organic solvent and a reducing agent.

The invention will be detailed in the following examples, but is not limited thereto.

EXAMPLE 1

(Preparation of Presensitized Planographic Printing Plate 1)

The aluminum alloy having the composition as shown in Table 1 was melted and molded according to a semi-continuous molding method to produce ingot having a size of 400 mm×1000 mm×3000 mm. Ten mm were removed from each surface of the ingot. The resulting ingot was uniformized at 550° C. for 6 hours, hot rolled to obtain a 5 mm thick plate, and cold rolled to obtain a 1.5 mm thick plate. The resulting plate was batch annealed at 400° C. for 2 hours, and finally cold rolled to obtain an aluminum alloy plate support having a thickness of 0.3 mm.

The resulting support was dipped for 30 seconds in a 10% sodium hydroxide aqueous solution kept at 85° C. to degrease, and then washed with water. The resulting aluminum plate was dipped for 1 minute in a 10% sulfuric acid aqueous solution kept at 25° C. to desmut, and then washed with water. The resulting aluminum plate was electrolytically etched in 1.5% nitric acid aqueous solution for 30 seconds at 30° C. at a current density of 60 $A/dm^2$, employing a 50 Hz sine wave alternate current. The etched plate was dipped for 10 seconds in a 10% sodium hydroxide aqueous solution at 60° C., then dipped for 20 seconds in a 10% sulfuric acid aqueous solution kept at 25° C. to desmut, and then washed with water. The resulting plate was anodized for 60 seconds in a 20% sulfuric acid aqueous solution at 35° C. at a current density of 3 $A/dm^2$, and then washed with water. Thus, support 1 was obtained.

The following light sensitive composition coating solution was coated on the surface of the support 1 by a wire bar, and then dried for 2 minutes at 80° C. to give a light sensitive layer having a dry thickness of 2.0 $g/m^2$. Thus, a presensitized planographic printing plate 1 was obtained. presensitized planographic printing plate 2 to 4 were prepared in the same manner as in presensitized planographic printing plate 1, except that aluminum alloy supports 2 to 4 as shown in Table 1 were used.

| | |
|---|---|
| Novolak resin (phenol/m-cresol/p-cresol, 10/54/36, mol ratio), Mw: 4,000) | 6.70 g |
| Condensation product (esterification rate: 30%) of a pyrogallol-acetone resin (Mw: 3,000) with o-naphthoquinone diazide-5-sulfonylchloride | 1.50 g |
| Polyethylene glycol #2,000 | 0.20 g |
| Victoria Pure Blue BOH (made by Hodogaya Kagaku Co., Ltd.) | 0.08 g |
| 2,4-Bis(trichloromethyl)-6-(p-methoxystyryl)-s-triazine | 0.15 g |
| FC-430 (made by Sumitomo 3M Co., Ltd.) | 0.03 g |
| Cis-1,2-Cyclohexanedicarboxylic acid | 0.02 g |
| Methyl cellosolve | 100 ml |

TABLE 1

| Presensitized planographic printing plate No. | Aluminum alloy support No. | Composition (weight %) of the support | | | | | | | | Remarks |
|---|---|---|---|---|---|---|---|---|---|---|
| | | Na | Fe | Cu | Mn | Mg | Zn | Ti | Ga | |
| 1 | 1 | 0.013 | 0.233 | 0.021 | 0.004 | 0.004 | 0.005 | 0.028 | 0.009 | Inv. |
| 2 | 2 | 0.026 | 0.304 | 0.008 | 0.011 | 0.010 | 0.007 | 0.009 | 0.011 | Inv. |
| 3 | 3 | 0.052 | 0.314 | 0.015 | 0.007 | 0.005 | 0.003 | 0.007 | 0.011 | Comp. |
| 4 | 4 | 0.000 | 0.692 | 0.303 | 0.003 | 0.005 | 0.011 | 0.009 | 0.030 | Comp. |

Inv.: Invention
Comp.: Comparative

Each of the presensitized planographic printing plates obtained above was cut to 80×60 cm, and exposed at 8 $mw/cm^2$ for 60 seconds employing a 4 kw metal halide lamp. The exposed plate was then developed at 30° C. for 40 seconds employing a developer obtained by diluting a commercially available developer SDR-1 (made by Konica Corporation) with water at a factor of 6 to obtain a positive-working printing plate for a print run. The resulting printing plate was evaluated according to the following evaluation method.

(Evaluation)

(Stains)

The positive-working printing plate was further heated at 250° C. for 60 seconds for burning treatment, cooled to room temperature, washed with water, and then gummed. Employing the printing plate obtained above, printing was carried out on a printing machine (DAIYA1F-1 produced by Mitsubishi Jukogyo Co., Ltd.), wherein a coated paper, dampening water (Etch Solution SG-51 (concentration 1.5%) produced by Tokyo Ink Co., Ltd.) and printing ink (Hyplus M magenta produced by Toyo Ink Manufacturing Co., Ltd.) were used. Thus, one hundred prints were obtained, and the non-image portions of the one hundredth print were evaluated according to the following criteria:

A: No stains occurred at non-image portions.

B: Several stains occurred at non-image portions.

C: Stains occurred at a part of non-image portions or at the entire non-image portions.

(Stop dirtiness occurred on the support after printing was started, stopped during a predetermined interval, and then resumed)

Printing was carried out in the same manner as above, except that the positive-working printing plate was not subjected to burning treatment and gumming, and pure water was used as dampening water. After five thousand sheets of coated paper were printed, printing was stopped for 1 hour, and then printing was resumed to obtain one hundred prints. The number of stop dirtiness occurred on 100 $cm^2$ non-image portions of the one hundredth print at resumption of a print run was counted for evaluation.

The results are shown in Table 2.

TABLE 2

| Presensitized planographic printing plate No. | Aluminum alloy support No. | Stains | Number per 100 $cm^2$ of stop dirtiness | Remarks |
|---|---|---|---|---|
| 1 | 1 | A | 2 | Invention |
| 2 | 2 | A | 5 | Invention |
| 3 | 3 | C | 86 | Comparative |
| 4 | 4 | B | 43 | Comparative |

As is apparent from Table 2, the planographic printing plates 1 and 2 employing the aluminum alloy support of the invention produced no stain, and provided surprisingly reduced stop dirtiness as compared with the comparative samples. The aluminum alloy support of the invention provides extremely superior printing properties.

What is claimed is:

1. A presensitized planographic printing plate comprising a support and provided thereon, a light sensitive layer, wherein the support is an aluminum alloy support having a sodium content of 0.005 to 0.040 weight %.

2. The presensitized planographic printing plate of claim 1, wherein the support is an aluminum alloy support further containing zinc, and having the total content of sodium and zinc of 0.01 to 0.040 weight %.

3. The presensitized planographic printing plate of claim 1, wherein the light sensitive layer contains an alkali soluble resin and an o-quinonediazide compound.

4. The presensitized planographic printing plate of claim 3, wherein the light sensitive layer contains the alkali soluble resin in an amount of 5 to 90% by weight and the o-quinonediazide compound in an amount of 6 to 60% by weight.

5. The presensitized planographic printing plate of claim 3, wherein the o-quinonediazide compound is an ester compound of o-naphthoquinonediazide sulfonic acid and a polycondensate resin of phenols with aldehydes or ketones.

6. The presensitized planographic printing plate of claim 3, wherein the dry coating amount of the light sensitive layer is 0.2 to 10 $g/m^2$.

7. The presensitized planographic printing plate of claim 1, wherein the support has a thickness of 0.10 to 0.50 mm.

8. The presensitized planographic printing plate of claim 3, wherein the support is subjected to roughening treatment and anodizing treatment.

* * * * *